(12) United States Patent
Morita et al.

(10) Patent No.: US 7,777,194 B2
(45) Date of Patent: Aug. 17, 2010

(54) CHARGED PARTICLE BEAM APPARATUS

(75) Inventors: Hiroshi Morita, Mito (JP); Ryozo Takeuchi, Hitachi (JP); Ayumu Hatanaka, Tokai (JP)

(73) Assignee: Hitachi High-Technologies Corporation, Tokyo (JP)

( * ) Notice: Subject to any disclaimer, the term of this patent is extended or adjusted under 35 U.S.C. 154(b) by 224 days.

(21) Appl. No.: 12/073,918

(22) Filed: Mar. 12, 2008

(65) Prior Publication Data

US 2008/0224064 A1    Sep. 18, 2008

(30) Foreign Application Priority Data

Mar. 14, 2007   (JP)   ............... 2007-064494

(51) Int. Cl.
*G21K 1/08* (2006.01)
*H01J 25/10* (2006.01)
*H05B 31/26* (2006.01)

(52) U.S. Cl. ............... 250/396 R; 250/423 R; 250/492.3; 250/492.21; 250/424; 315/5.42; 315/31; 315/81

(58) Field of Classification Search ............. 250/396 R, 250/423 R, 424, 492.21, 492.3; 315/5.41, 315/5.42, 111.31, 111.51, 111.81, 111.91
See application file for complete search history.

(56) References Cited

U.S. PATENT DOCUMENTS 4,628,396 A * 12/1986 Flemming .................. 361/91.1

7,236,569 B2    6/2007  Takeuchi et al.
2002/0054764 A1* 5/2002 Shikano ................. 396/429
2008/0224064 A1* 9/2008 Morita et al. ........... 250/396 R

FOREIGN PATENT DOCUMENTS

| JP | 49-115261 | 11/1974 |
| JP | 57-092746 | 6/1982 |
| JP | 58-161234 | 9/1983 |
| JP | 06-133535 | 5/1994 |
| JP | 09-023638 | 1/1997 |

OTHER PUBLICATIONS

Japanese Notice of Rejection, with partial English Translation, issued in Japanese Patent Application No. JP 2007-064494, dated Apr. 28, 2009.

* cited by examiner

*Primary Examiner*—Bernard E Souw
(74) *Attorney, Agent, or Firm*—McDermott Will & Emery LLP

(57) ABSTRACT

A charged particle beam apparatus in which discharge is less likely to occur between a charged particle source, and an extraction electrode, and an acceleration electrode without the need for increasing the capacity of a high voltage power supply for extraction. The charged particle beam apparatus includes a charged particle source which emits charged particles, an extraction electrode which extracts the charged particles from the charge particle source and an acceleration electrode which accelerates the extracted charged particles. A surge absorber is electrically connected between at least two of the charged particle source, the extraction electrode, and the acceleration electrode.

13 Claims, 3 Drawing Sheets

(a)

(c)

(b)

(d)

CHARGED PARTICLE BEAM APPARATUS

CLAIM OF PRIORITY

The present application claims priority from Japanese application serial No. 2007-64494 filed on Mar. 14, 2007, the content of which is hereby incorporated by reference into this application.

FIELD OF THE INVENTION

The present invention relates to a charged particle apparatus which emits charged particles and produces a charged particle beam and more particularly to an electron microscope which uses a charged particle beam as an electron beam.

BACKGROUND OF THE INVENTION

Among various types of charged particle devices, the most widely used one is an electron microscope. The electron microscope has an electron gun chamber the inside of which is kept at a low pressure and the electron gun chamber houses a cathode as an electron source for emission of electrons, an extraction electrode for extraction of electrons from the cathode, and an acceleration electrode for acceleration of extracted electrons. The accelerated electrons constitute an electron beam which is irradiated on a specimen to observe the specimen. In such a field-emission type electron microscope, a high electric field is applied between the cathode and, the extraction electrode and acceleration electrode, in order to produce an electron beam, as described in JP-A No. 58(1983)-161234 (FIG. 2).

SUMMARY OF THE INVENTION

In the conventional electron microscope, since a high electric field is applied between a cathode and, an extraction electrode and an acceleration electrode, even if the acceleration electrode is set at the ground potential, the cathode and the extraction electrode are isolated from the electron gun chamber kept at the ground potential and discharge may occur between any two of the cathode, extraction electrode and acceleration electrode (electron gun chamber). Particularly it is thought that when discharge occurs on the cathode, the current flowing through the cathode increases and due to Joule heat the tip of the cathode evaporates or deforms and a further field emission becomes impossible.

In order to suppress such discharge, JP-A No. 58(1983)-161234 discloses a technique that between a cathode and an extraction electrode, a circuit is connected where a diode 12 is connected in series with a parallel circuit comprised of a capacitor and a resistor. However, in this circuit, since during normal operation of the electron microscope a large current flows through the bypass (comprised of the diode and resistor), a high voltage power supply for extraction which applies a voltage between the cathode and extraction electrode to extract electrons from the cathode must have a large capacity.

It is thought that the above problem attributable to such discharge can arise not only in electron microscopes but also in charged particle devices which irradiate a charged particle beam on a specimen.

Therefore, an object of the present invention is to provide a charged particle beam apparatus in which discharge is less likely to occur between a charged particle source and, an extraction electrode and an acceleration electrode.

In order to achieve the above object, according to one aspect of the invention, there is provided a charged particle beam apparatus which comprises a charged particle source which emits charged particles, an extraction electrode which extracts the charged particles from the charge particle source, and an acceleration electrode which accelerates the extracted charged particles. Here, a surge absorber is electrically connected between at least two of the charged particle source, the extraction electrode, and the acceleration electrode.

According to another aspect of the invention, there is provided a charged particle beam apparatus which comprises a charged particle source which emits charged particles, an extraction electrode which extracts the charged particles from the charge particle source, and an acceleration electrode which accelerates the extracted charged particles. Here, a surge absorber is electrically connected between at least one of the charged particle source, the extraction electrode, and the acceleration electrode, and a ground potential.

According to the present invention, it is possible to provide a charged particle beam apparatus in which discharge is less likely to occur between a charged particle source and, an extraction electrode and an acceleration electrode without the need for increasing the capacity of a high voltage power supply for extraction.

BRIEF DESCRIPTION OF THE DRAWINGS

The invention will be more particularly described with reference to the accompanying drawings, in which:

FIG. 3A shows a surge absorber according to a first variation, FIG. 3B shows a surge absorber according to a second variation, FIG. 3C shows a surge absorber according to a third variation, and FIG. 3D shows a surge absorber according to a fourth variation;

DETAILED DESCRIPTION OF THE PREFERRED EMBODIMENTS

Figure 1:
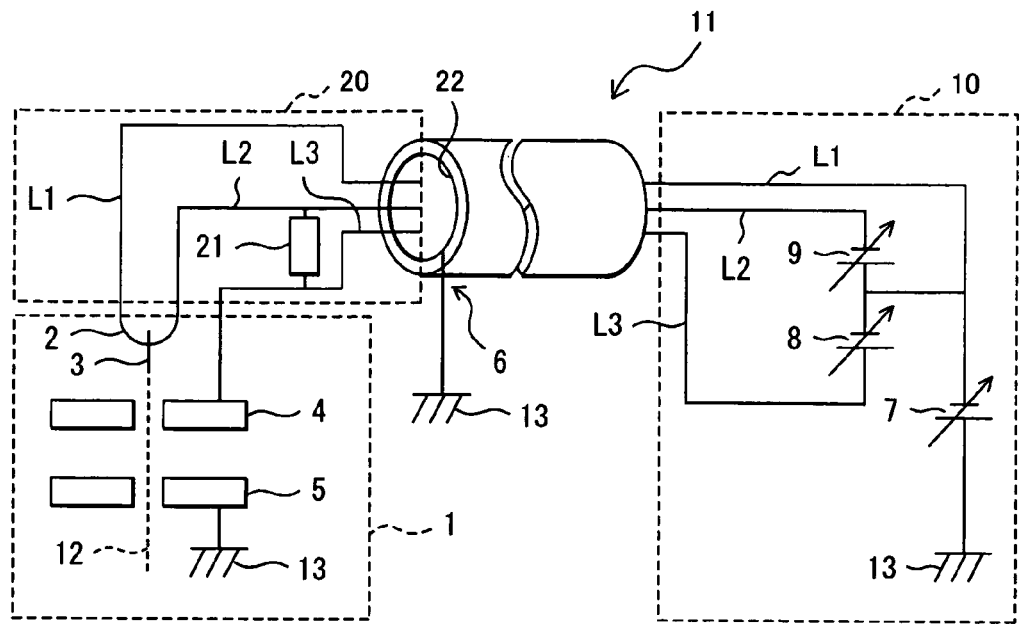
FIG. 1 is a schematic diagram showing the structure of a charged particle beam apparatus according to a first embodiment of the invention.

Next, preferred embodiments of the present invention will be described in detail referring to the accompanying drawings. In the drawings, the same elements are designated by the same reference numerals and descriptions thereof are not repeated. In explanations of preferred embodiments given below, it is assumed that a charged particle beam apparatus is an electron microscope which uses a field-emission electron gun. However, the present invention is not limited to electron microscopes but can be applied to inspection, measuring, and exposure apparatuses which use electron beams, ion implanting apparatuses which use ion beams, and processing apparatuses which use beams of charged particles such as electrons, ions and clusters of charged particles.

First Embodiment

As shown in FIG. 1, an electron microscope 11 according to a first embodiment of the present invention has an electron gun chamber 1 the inside of which is kept at a low pressure. Inside the electron gun chamber 1 are a cathode 3 for emission of electrons 12 and a heating filament 2 for heating the cathode 3. The heating filament 2 is connected with the cathode 3 and supports the cathode 3.

Also, an extraction electrode 4 is located in the electron gun chamber 1. The extraction electrode 4 gives an intense electric field to the tip of the cathode 3 to extract electrons 12 from the cathode 3.

The electron gun chamber 1 also houses an acceleration electrode (ground electrode) 5. The acceleration electrode 5 is connected with a ground potential 13 and, when an intense electric field is given between the cathode 3 and the acceleration electrode 5, it accelerates electrons 12 extracted from the cathode 3.

Both ends of the heating filament 2 are connected with wire L1 and wire L2. The extraction electrode 4 is connected with wire L3. Wires L1, L2, and L3 are embedded in a cable head 20 in the vicinity of the electron gun chamber 1.

The cable head 20 is connected with a cable 6 and the cable 6 is led from the cable head 20 to a high voltage power supply tank 10 to connect the electron gun chamber 1 and the cable head 20 with the high voltage power supply tank 10. Wires L1, L2, and L3 are led through the cable 6 into the high voltage power supply tank 10. A shield wire 22 is provided around the cable 6 and connected with the ground potential 13. The cable 6 electrically connects the cathode 3 and extraction electrode 4 with a high voltage power supply for extraction 8. The cable 6 also electrically connects the cathode 3 and acceleration electrode 5 with a high voltage power supply for acceleration 7.

The high voltage power supply tank 10 houses the high voltage power supply for acceleration 7 to give a high negative potential (at least dozens of kilovolts) to the cathode 3, the high voltage power supply for extraction 8 to give a potential difference of about dozens of kilovolts between the cathode 3 and the extraction electrode 4 for field emission, and a filament heating power supply 9 to heat the heating filament 2. The high voltage power supply for acceleration 7 applies a high voltage for acceleration of electrons 12 between the cathode 3 and the acceleration cathode 5. The high voltage power supply for extraction 8 applies a high voltage for extraction of electrons 12 between the cathode 3 and the extraction electrode 4.

The negative pole of the high voltage power supply for acceleration 7 is connected with the cathode 3 through wire L1 and the heating filament 2. The positive pole of the high voltage power supply for acceleration 7 is grounded and equivalently connected with the acceleration electrode (ground electrode) 5. The negative pole of the high voltage power supply for extraction 8 is connected through wire L1 and the heating filament 2 to the cathode 3. The positive pole of the high voltage power supply for extraction 8 is connected through wire L3 to the extraction electrode 4. The negative pole of the filament heating power supply 9 is connected through wire L2 to one end of the heating filament 2. The positive pole of the filament heating power supply 9 is connected through wire L1 to the other end of the heating filament 2.

A surge absorber 21 is embedded in the cable head 20. The surge absorber 21 is connected between at least two of the cathode 3, the extraction electrode 4 and the acceleration electrode (ground electrode) 5. More specifically, as shown in FIG. 1, the first connection pattern is that the surge absorber 21 is electrically connected between wire L2 connected with the cathode 3 and wire L3 connected with the extraction electrode 4 (pattern 1a).

A second possible connection pattern (connection pattern 1b) is that the surge absorber 21 is electrically connected between wire L1 connected with the cathode 3 and wire L3 connected with the extraction electrode 4 (pattern 1b), though not shown.

A third possible connection pattern (pattern 1c) is that the surge absorber 21 is electrically connected between wire L1 or L2 connected with the cathode 3 and the acceleration electrode (ground electrode) 5.

A fourth possible connection pattern (pattern 1d) is that the surge absorber 21 is electrically connected between the extraction electrode 4 and wire L3 connected with the extraction electrode 4, and the acceleration electrode (ground electrode) 5.

Only one of these connection patterns 1a through 1d may be used or a combination of these may be used.

Figure 2:
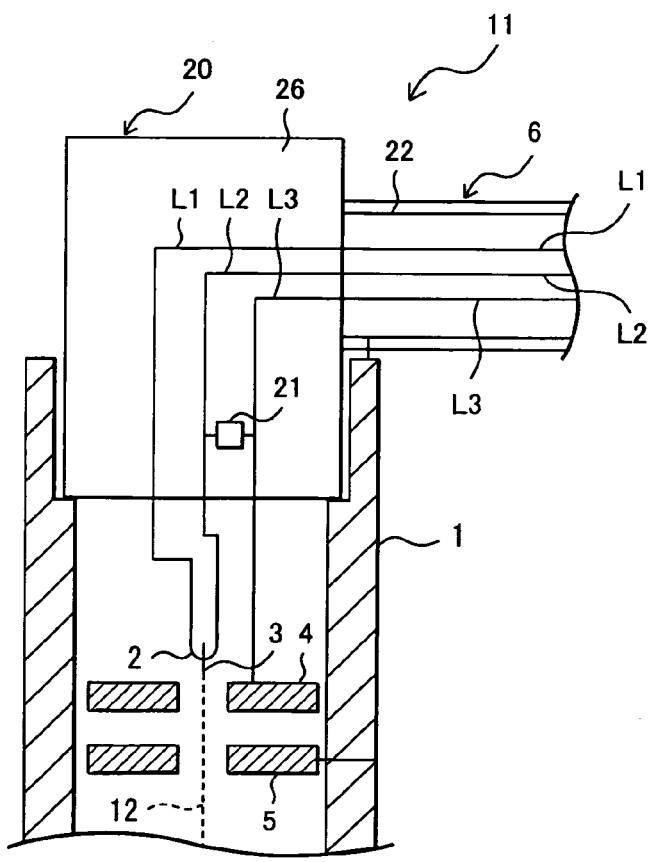
FIG. 2 is a sectional view of an electron gun chamber and its vicinity in a charged particle beam apparatus according to the first embodiment.

As shown in FIG. 2, the shield wire 22 of the cable 6 is electrically connected with the electron gun chamber 1, which is made of metal. The acceleration electrode (ground electrode) 5 is also electrically connected with the electron gun chamber 1. By connecting the electron gun chamber 1 with the ground potential 13 (see FIG. 1), the shield wire 22 and the acceleration electrode (ground electrode) 5 are connected with the ground potential.

The cable head 20 has an insulating seal 26 which seals the electron gun chamber 1 to keep the inside of the electron gun chamber 1 at a low pressure. The seal 26 is made of an insulating material such as epoxy resin or rubber. The cable head 20 electrically connects the cathode 3, extraction electrode 4 and acceleration electrode 5 with the cable 6 and incorporates wires L1, L2, and L3 which penetrate the seal 26.

The cathode 3 is attached to the tip of the heating filament 2. Desirable materials for the cathode 3 include tungsten (W), lanthanum hexaboride ($LaB_6$) and carbon nanotubes. The curvature radius of the tip of the cathode 3 is very small and if the material is tungsten or lanthanum hexaboride, the curvature radius is approximately 1000 Å or in the case of carbon nanotubes, it is approximately 10 Å. When a voltage is applied between the cathode 3 and the extraction electrode 4, a high electric field is generated on the tip of the cathode 3 and in its vicinity. As the cathode 3 is heated by the heating filament 2 and a high electric field is generated thereon, it emits electrons, or functions as an electron source in the electron microscope 11.

Due to external noise a sudden voltage rise may occur in the cable 6 or any of the power supplies 7 to 9 in the high voltage power supply tank 10 during normal operation of the electron microscope 11. In this case, one possible consequence is as follows. The voltage increase caused by external noise is superimposed on the high voltage applied between the extraction electrode 4 and the acceleration electrode 5, resulting in vacuum discharge. When vacuum discharge occurs, the potential of the extraction electrode 4 instantaneously becomes the same as that of the acceleration electrode (ground electrode) 5, namely the ground potential 13, and therefore an acceleration voltage of dozens of kilovolts is transiently applied between the cathode 3 and the extraction electrode 4. Consequently an overvoltage is applied between the cathode 3 and the extraction electrode 4. Since the curvature radius of the tip of the cathode 3 is as small as approximately 1000 Å, this overvoltage increases the emission current from the cathode 3 and due to Joule heat the tip of the cathode 3 evaporates or deforms and consequently the cathode 3 becomes unable to emit electrons again.

On the other hand, according to the electron microscope 11 in the first embodiment, since the surge absorber 21 is electrically connected between at least two of the cathode 3, extraction electrode 4, and acceleration electrode 5, an isolation is made between the cathode 3, extraction electrode 4, and acceleration electrode 5 with high resistance during normal operation and if a voltage rise occurs due to external noise, the electric resistance of the surge absorber 21 will rapidly decline and thus a current will flow through the surge absorber 21 as a bypass, thereby suppressing the voltage rise. Therefore, vacuum discharge is less likely to occur, preventing damage to the cathode 3 due to evaporation or deformation. Since this bypass is not formed during normal operation, there is no need to increase the capacities of the power supplies 7 to 9.

It is desirable to use at least one of the arrester or varistor for the surge absorber 21.

The arrester consists of a container of ceramic or similar material filled with special gas in which a positive and a negative terminal are placed with a gap between them. The arrester is electrically isolated when the voltage between the terminals is low; however, if a prescribed voltage level is exceeded as a result of application of a transient voltage, the gas between the terminals discharges electricity and the arrester becomes electrically conductive.

The varistor is a device with zinc oxide (ZnO), silicon carbide (SiC), titanic acid strontium ($SrTiO_3$) or similar substance between a positive and a negative terminal. In the varistor, when the voltage between the terminals is low, the electric resistance is high but if the voltage exceeds a prescribed level, the electric resistance rapidly decreases.

In the case of the arrester, the prescribed voltage level is set to be higher than the voltage in normal operation and lower than the voltage at which discharge begins. As the voltage between the terminals of the arrester rises and exceeds the prescribed voltage level, before reaching the voltage at which discharge begins between the electrodes 3 to 5, discharge occurs between the terminals of the arrester and the electric resistance between the terminals rapidly decreases. As a consequence, a current flows in the arrester and the voltage between the terminals decreases, thereby suppressing the rise in the voltage between the electrodes 3, 4 and 5. This suppresses discharge between the electrodes 3 to 5.

In the case of the varistor as well, the prescribed voltage level is set to be higher than the voltage in normal operation and lower than the voltage at which discharge begins. As the voltage between the terminals of the varistor rises and exceeds the prescribed voltage level, the electric resistance between the terminals of the varistor rapidly decreases before reaching the voltage at which discharge begins between the electrodes 3 to 5. As a consequence, a current flows in the varistor and the voltage between the terminals decreases, thereby suppressing the rise in the voltage between the electrodes 3 to 5. This suppresses discharge between the electrodes 3 to 5.

Therefore, an overcurrent is less likely to occur, which prevents increase in the emission current from the cathode 3 due to an overcurrent and thus prevents evaporation or deformation of the tip of the cathode 3. In addition, in normal operation, the electric resistance between terminals of the arrester or varistor is high and thus the current flowing in the arrester or varistor is small, which means that the required capacities of the power supplies 7 to 9 are small.

The surge absorber 21 should preferably be connected nearer to the cathode 3, etc. (electrodes 3 to 5) than the cable 6. As it is nearer to the cathode 3, etc., wire L2 and other wires between the surge absorber 21 and the cathode 3, etc. may be shorter and the capacities and resistances of the wires between the surge absorber 21 and the cathode 3, etc. may be smaller; therefore, the voltage between the terminals of the surge absorber 21 can quickly rise in response to rise in the voltages of the cathode 3, etc. due to external noise. Consequently, even if the voltages of the cathode 3, etc. suddenly rise, the resistance of the surge absorber 21 may be made low before reaching the voltage at which discharge begins. Conversely, if it is known that the voltages of the cathode 3, etc. will gradually rise due to external noise, the voltage between the terminals of the surge absorber 21 has only to rise gradually and thus the surge absorber 21 maybe connected farther away from the electrodes 3 to 5 than the cable 6.

Variation 1 of the First Embodiment

Figure 3:
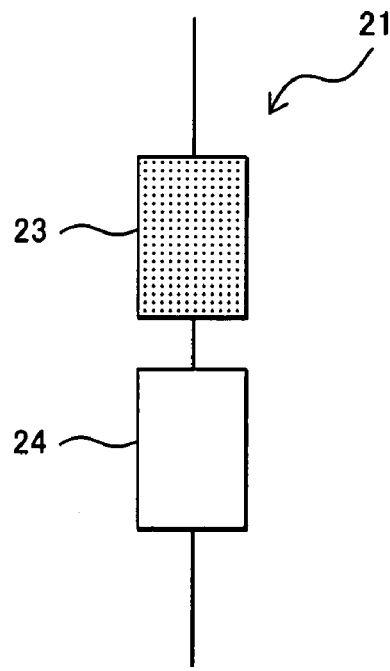
FIG. 3A to 3D are schematic diagram showing the detail of surge absorber of the first embodiment.
Figure 3:
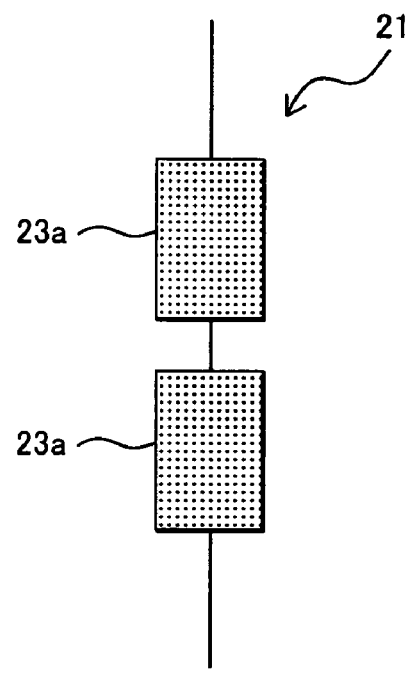
Figure 3:
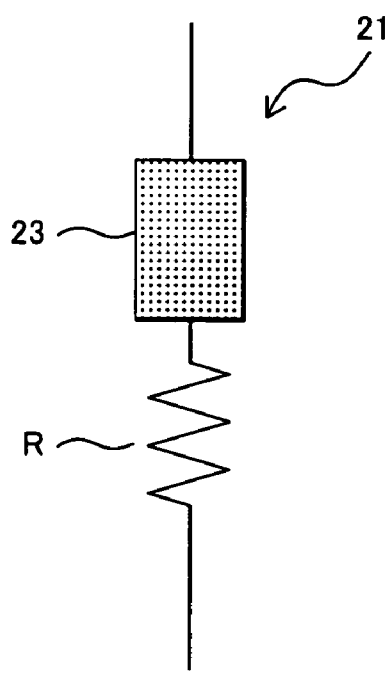
Figure 3:
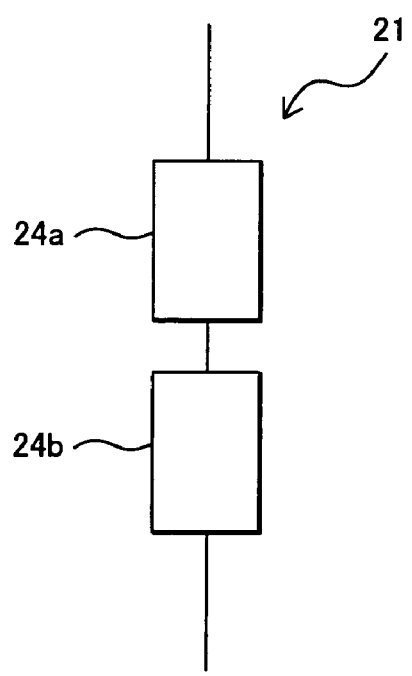

FIG. 3A shows a surge absorber 21 of a charged particle beam apparartus according to a first variation of the first embodiment of the present invention. In the surge absorber 21 according to the first variation of the first embodiment, an arrester 23 and a varistor 24 are connected in series. The arrester 23 is electrically isolated when the voltage between terminals is low but if a given transient voltage is applied, discharge occurs between the terminals and the arrester becomes conductive. Once the arrester 23 becomes conductive by itself, the "follow current" phenomenon occurs in which discharge continues even when the voltage between the terminals becomes low. As a solution to this problem, the arrester 23 is connected with the varistor 24 in series and even when the arrester 23 is conductive, the varistor 24 produces a certain level of resistance and thus suppresses the current and controls the follow current phenomenon. Consequently, after suppression of voltage rise due to external noise, normal operation is resumed.

Variation 2 of the First Embodiment

FIG. 3B shows a surge absorber 21 of a charged particle beam apparatus according to a second variation. In the second variation, the varistor 24 in the first variation is replaced by a constant resistor R. The constant resistor R divides the voltage applied to the surge absorber 21. For example, the resistance value of the constant resistor R is set to a value between high and low resistance values of the arrester 23. When the resistance of the arrester 23 is high, almost all the voltage applied to the surge absorber 21 can be applied to the arrester 23. Hence, there is no deterioration in response to voltage rise. It is also possible to ensure that when the resistance of the arrester 23 is low, virtually none of the voltage applied to the surge absorber 21 is applied to the arrester 23. Therefore, the arrester 23 can be restored to high resistance and the follow current phenomenon can be controlled.

Variation 3 of the First Embodiment

FIG. 3C shows a surge absorber 21 of a charged particle beam apparatus according to a third variation. In the surge absorber 21 according to the third variation of the first embodiment, plural arresters 23a and 23b are connected in series. Consequently, the abovementioned prescribed voltage can be easily set using ready-made arresters 23a and 23b.

Variation 4 of the First Embodiment

FIG. 3D shows a surge absorber 21 of a charged particle beam apparatus according to a fourth variation. In the surge absorber 21 according to the fourth variation of the first embodiment, plural varistors 24a and 24b are connected in series. Consequently, the abovementioned prescribed voltage can be easily set using ready-made varistors 24a and 24b.

Second Embodiment

Figure 4:
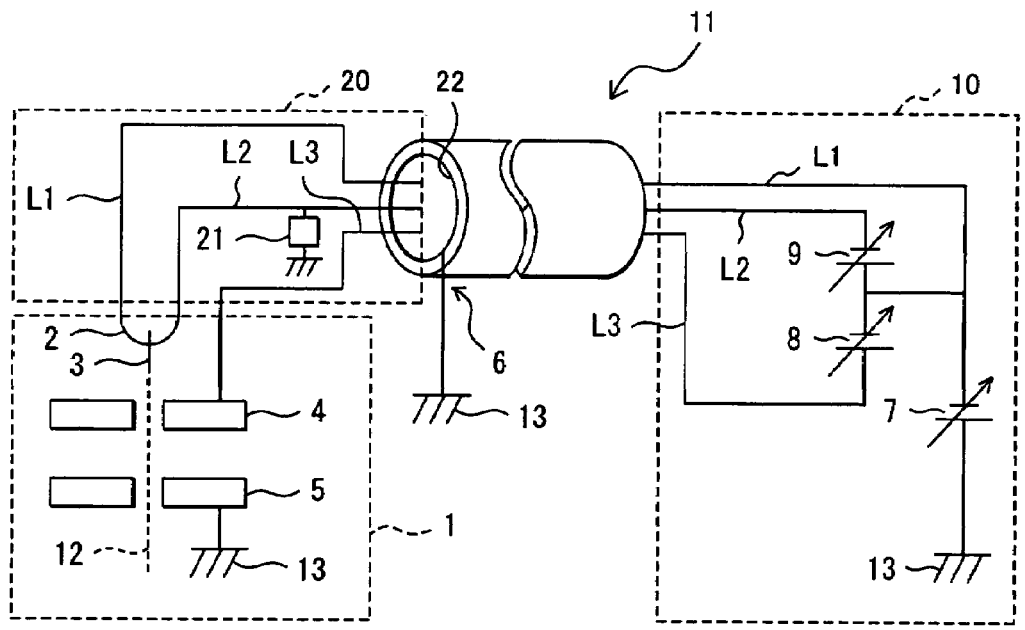
FIG. 4 is a schematic diagram showing the structure of a charged particle beam apparatus according to a second embodiment of the invention.
Figure 5:
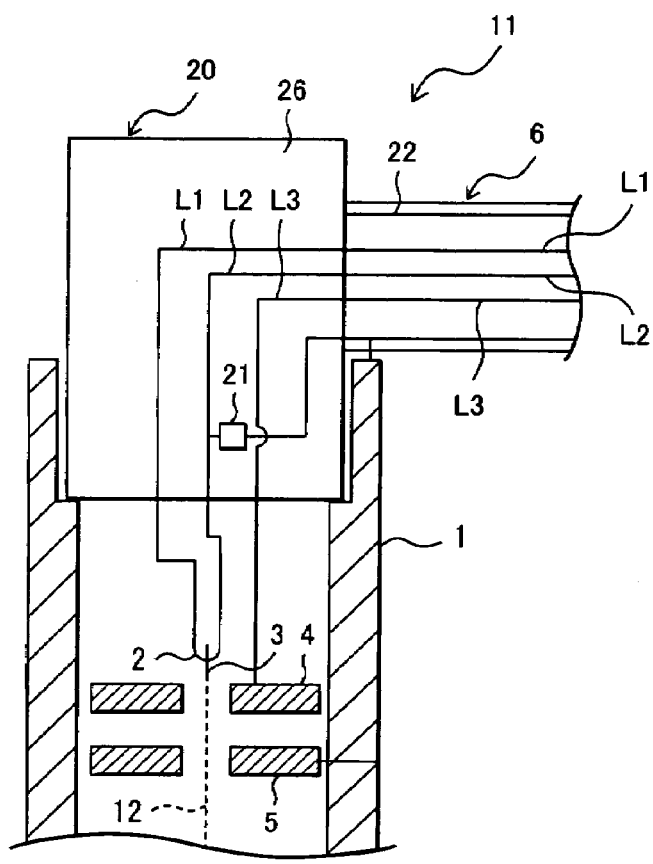
FIG. 5 is a sectional view of an electron gun chamber and its vicinity in a charged particle beam apparatus according to the second embodiment.

FIG. 4 shows the structure of the electron microscope 11 according to a second embodiment of the present invention and FIG. 5 is a sectional view of the electron gun chamber 1 of the charged particle beam apparatus 11 and its vicinity according to the second embodiment. The electron microscope 11 in the second embodiment is different from the electron microscope 11 in the first embodiment in that the surge absorber 21 is electrically connected between the charged particle source (cathode) 3 and the ground potential 13 (connection pattern 2a).

The connection pattern is not limited thereto but connection pattern 2b maybe selected in which unlike connection pattern 2a, the surge absorber 21 is not connected with wire L2 but is electrically connected between wire L1 connected with the cathode 3 and the ground potential 13.

Alternatively, connection pattern 2c may be selected in which the surge absorber 21 is electrically connected between wire L3 connected with the extraction electrode 4 and the ground potential 13.

When the acceleration electrode 5 is not connected with the ground potential 13, the surge absorber 21 may also be electrically connected between the acceleration electrode 5 and the ground potential 13 (connection pattern 2d). One of these connection patterns 2a to 2d or a combination of them may be used.

It may be said that while a rise in the voltage applied between the electrodes 3 to 5 is detected and controlled by the surge absorber 21 in the first embodiment, a rise in the voltage applied between the electrodes 3 to 5 and the ground potential 13, namely a rise in the potential of the electrodes 3 to 4 with respect to the ground potential 13 is detected and controlled by the surge absorber 21 in the second embodiment. Even in the second embodiment, a rise in the potential (voltage) of the electrodes 3 to 5 can be detected and controlled as in the first embodiment, so that the same advantageous effect as in the first embodiment can be achieved.

What is claimed is:

1. A charged particle beam apparatus comprising:
a charged particle source which emits charged particles;
an extraction electrode which extracts the charged particles from the charge particle source;
an acceleration electrode which accelerates the extracted charged particles; and
a surge absorber that is electrically connected between at least two of the charged particle source, the extraction electrode, and the acceleration electrode.

2. A charged particle beam apparatus comprising:
a charged particle source which emits charged particles;
an extraction electrode which extracts the charged particles from the charge particle source; and
an acceleration electrode which accelerates the extracted charged particles; and
a surge absorber that is electrically connected between at least one of the charged particle source, the extraction electrode, and the acceleration electrode, and a ground potential.

3. The charged particle beam apparatus according to claim 1, wherein the surge absorber includes at least one of an arrester and a varistor.

4. The charged particle beam apparatus according to claim 2, wherein the surge absorber includes at least one of an arrester and a varistor.

5. The charged particle beam apparatus according to claim 1, wherein the surge absorber includes an arrester and at least one of a varistor and a resistor element which are connected with the arrester in series.

6. The charged particle beam apparatus according to claim 2, wherein the surge absorber includes an arrester and at least one of a varistor and a resistor element which are connected with the arrester in series.

7. The charged particle beam apparatus according to claim 1, further comprising:
a high voltage power supply for extraction which applies a high voltage between the charged particle source and the extraction electrode to extract the charged particles;
a high voltage power supply for acceleration which applies a high voltage between the charged particle source and the acceleration electrode to accelerate the charged particles; and
a cable which electrically connects the charged particle source and the extraction electrode with the high voltage power supply for extraction, and electrically connects the charged particle source and the acceleration electrode with the high voltage power supply for acceleration,
wherein the surge absorber is nearer to the charged particle source or the extraction electrode or the an acceleration electrode than the cable and is electrically connected with at least one of the charged particle source, the extraction electrode, and the acceleration electrode.

8. The charged particle beam apparatus according to claim 2, further comprising:
a high voltage power supply for extraction which applies a high voltage between the charged particle source and the extraction electrode to extract the charged particles;
a high voltage power supply for acceleration which applies a high voltage between the charged particle source and the acceleration electrode to accelerate the charged particles; and
a cable which electrically connects the charged particle source and the extraction electrode with the high voltage power supply for extraction and electrically connects the charged particle source and the acceleration electrode with the high voltage power supply for acceleration,
wherein the surge absorber is nearer to the charged particle source or the extraction electrode or the an acceleration electrode than the cable and is electrically connected with at least one of the charged particle source, the extraction electrode, and the acceleration electrode.

9. The charged particle beam apparatus according to claim 7, further comprising:
an electron gun chamber which houses the charged particle source, the extraction electrode, and the acceleration electrode and is kept at a low pressure; and
a cable head which includes an insulating seal for sealing the electron gun chamber, and a wire which electrically connects the charged particle source, the extraction electrode and the acceleration electrode with the cable and penetrates the seal,
wherein the surge absorber is electrically connected with the wire and embedded in the cable head.

10. The charged particle beam apparatus according to claim 8, further comprising:
an electron gun chamber which houses the charged particle source, the extraction electrode, and the acceleration electrode and is kept at a low pressure; and a cable head which includes an insulating seal for sealing the electron gun chamber, and a wire which electrically connects the charged particle source, the extraction electrode and the acceleration electrode with the cable and penetrates the seal, wherein the surge absorber is electrically connected with the wire and embedded in the cable head.

11. A charged particle beam apparatus including an electron gun, said electron gun comprising:

a cathode having a tip to emit charged particles;

an extraction electrode which extracts the charged particles from the cathode;

an acceleration electrode which accelerates the extracted charged particles; and a cable head holding a plurality of wires to supply voltage to the cathode, the extraction electrode, and the acceleration electrode, wherein said cable head is provided with a surge absorber connected between at least two of said plurality of wires.

12. The charged particle beam apparatus according to claim 11, wherein said surge absorber includes at least one of an arrester and a varistor.

13. The charged particle beam apparatus according to claim 11, wherein said surge absorber includes an arrester and at least one of a varistor and a resistor element which are connected with the arrester in series.

* * * * *